United States Patent
Hussain et al.

(10) Patent No.: US 6,344,684 B1
(45) Date of Patent: Feb. 5, 2002

(54) MULTI-LAYERED PIN GRID ARRAY INTERPOSER APPARATUS AND METHOD FOR TESTING SEMICONDUCTOR DEVICES HAVING A NON-PIN GRID ARRAY FOOTPRINT

(75) Inventors: Rafiqul Hussain, Fremont; Phuc Dinh Do, Santa Clara; Benjamin G. Tubera, Milpitas, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/610,865

(22) Filed: Jul. 6, 2000

(51) Int. Cl.[7] ................. H01L 23/48; H05K 7/02; G01R 31/02; H01R 9/89
(52) U.S. Cl. ............ 257/697; 257/690; 257/692; 257/693; 361/760; 361/764; 324/755; 439/71; 439/74
(58) Field of Search .............. 257/690–699; 361/760, 764; 324/755; 439/71, 74

(56) References Cited

U.S. PATENT DOCUMENTS

| | | | |
|---|---|---|---|
| 5,702,255 A | * | 12/1997 | Murphy et al. ............... 439/71 |
| 5,712,768 A | * | 1/1998 | Werther ...................... 361/767 |
| 5,896,037 A | * | 4/1999 | Kudla et al. ................. 324/755 |
| 6,097,609 A | * | 8/2000 | Kabadi ........................ 361/760 |

FOREIGN PATENT DOCUMENTS

| | | | |
|---|---|---|---|
| JP | 9-320718 | * 12/1997 | ............ H01R/3/76 |

* cited by examiner

Primary Examiner—Tom Thomas
Assistant Examiner—Ori Nadav

(57) ABSTRACT

A multi-layered pin grid array interposer used in a test socket for testing and converting a package having a non-pin grid array footprint to a pin grid array footprint. The multi-layered pin grid array interposer test socket includes a multi-layered pin grid array interposer, a semiconductor device mounted on a package having a non-grid array footprint and a fastener. The multi-layered pin grid array interposer includes a top signal layer having bonding pads on an upper surface, a bottom signal layer having a pin grid array footprint on a bottom surface, at least one power layer between ground layers, the ground layers being between the top signal layer and bottom signal layer, and a links for connecting the plurality of bonding pads to the pins of the pin grid array footprint. The fastener presses the package against the multi-layered pin grid array interposer connecting the leads of the package with the bonding pads.

12 Claims, 3 Drawing Sheets

MULTI-LAYERED PIN GRID ARRAY INTERPOSER APPARATUS AND METHOD FOR TESTING SEMICONDUCTOR DEVICES HAVING A NON-PIN GRID ARRAY FOOTPRINT

FIELD OF THE INVENTION

The present invention relates to a multi-layered pin grid array interposer apparatus and method for testing semiconductor devices having non-pin grid array footprints. The present invention has particular applicability in testing semiconductor devices having either a land grid array or a ball grid array footprint.

BACKGROUND ART

In order to test a semiconductor device, such as a microprocessor, the semiconductor device is placed into a socket, e.g., an end user socket, which is connected to a circuit board and the circuit board is connected to a motherboard. As long as the semiconductor device has a pin grid array footprint, the semiconductor device can be placed directly into a pin grid array socket. However, semiconductor devices having non-pin grid array footprints, such as a land grid array or a ball grid array footprint, are becoming increasingly common. Problems arise when these non-pin grid array semiconductor devices need to be tested. Since the circuit boards are configured for pin grid array connections, pin grid array sockets are used for connecting the semiconductor device to the circuit board. Therefore, in order to test a semiconductor device having a non-pin grid array footprint, each connection of the semiconductor device needs to be hard wired to the pin grid array socket. Therefore, there is a need for a pin grid array (PGA) interposer for converting the non-pin grid array footprint of a semiconductor device to a pin grid array footprint, thereby allowing the semiconductor device to be inserted into a pin grid array socket.

Moreover, in order to test semiconductor devices having high pin counts, a multi-layered PGA interposer is needed. However, multi-layered interposers suffer from crosstalk where power and signals on the pins glitch together causing voltage drops and noisy input and output signals which can lead to inaccurate test results. Therefore, there is a need for a multi-layered PGA interposer for testing semiconductor devices having non-pin grid array footprints in which the multi-layered interposer exhibits reduced the crosstalk among the layers.

SUMMARY OF THE INVENTION

The present invention is directed to a multi-layered pin grid array interposer for converting a non-pin grid array footprint of a semiconductor device on a package to a pin grid array footprint. The pin grid array interposer comprises a top signal layer having a plurality of bonding pads on an upper surface, a bottom signal layer having a pin grid array footprint on a bottom surface, at least one power plane between ground layers, the ground layers being between the top signal layer and the bottom signal layer, and a plurality of links for connecting the plurality of bonding pads to a plurality of pins of the pin grid array footprint.

An advantage of the present invention is the testing of semiconductor devices having non-pin grid array footprints. By using a multi-layered PGA interposer to convert the non-pin grid array footprint of a semiconductor device to a pin grid array footprint, the semiconductor device can be tested without requiring each connection to be hard wired, thereby allowing for efficient testing of the semiconductor device having a non-pin grid array footprint.

An additional advantage of the present invention is that the crosstalk between the layers of the multi-layered PGA interposer is reduced since the power plane is between two ground layers. Reducing crosstalk results in accurate test results.

According to the present invention, the foregoing and other advantages are achieved in part by using a multi-layered PGA interposer in which the power layer of the multi-layered PGA interposer is insulated from the signal layers thereby reducing crosstalk among the layers of the multi-layered PGA interposer.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Presently, there is no efficient method for testing semiconductor devices, such as IC chips or microprocessors, having non-pin grid arrays footprints. In order to test such semiconductor devices, each connection between the semiconductor device and a pin grid array socket need to be hardwired. Such a connection system is time consuming and increases the cost of the finished device and results in poor manufacturing yields. Therefore, a multi-layered interposer is needed to convert the non-pin grid array footprint to a pin grid array footprint, however multi-layered interposers suffer from crosstalk between the layers, thereby causing inaccurate test results. The present invention addresses and solves these problems.

Figure 1:
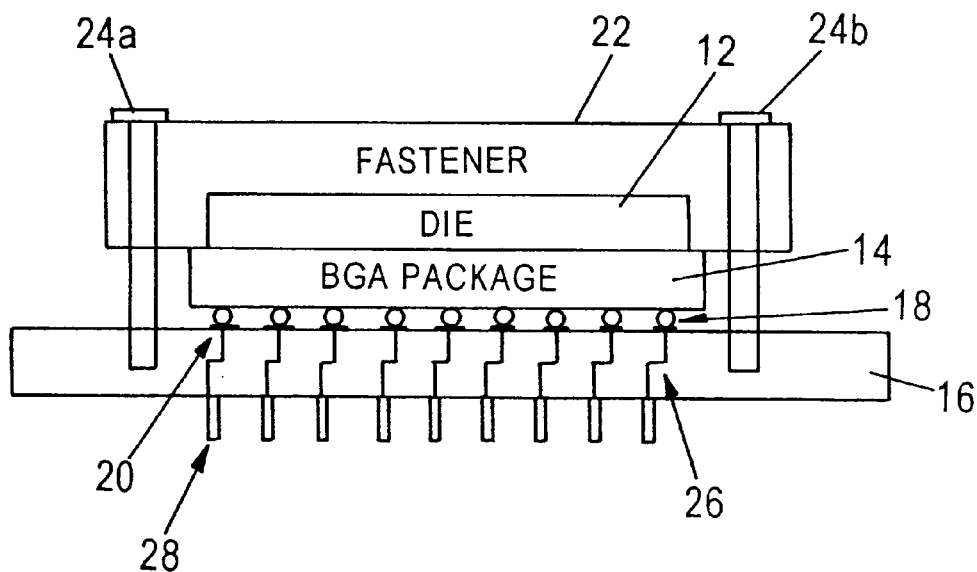
FIG. 1 is a side view of an exemplary multi-layered PGA interposer for converting a semiconductor device having a ball grid array footprint to a pin grid array footprint according to an embodiment of the present invention.

Referring to FIG. 1, a side view of an exemplary multi-layered PGA interposer for converting a semiconductor device having a ball grid array footprint to a pin grid array footprint according to an embodiment of the present invention is illustrated. As shown, a semiconductor device 12, such as a die is mounted on a ball grid array (BGA) package 14. The BGA package 14 is placed on the multi-layered PGA interposer 16. Solder balls 18 of the BGA package 14 are aligned with the bond pads 20 on the top surface of the multi-layered PGA interposer 16. The solder ball 18 and bond pad 20 pair provides an electrical connection between the BGA package 14 and the multi-layered PGA interposer 16. To prevent poor electrical connections, a fastener 22 presses the BGA package 14 against the PGA interposer 16. In certain preferred embodiments, screws 24a, 24b are used to press and secure the BGA package 14 to the multi-layered PGA interposer 16.

The multi-layered PGA interposer 16 includes links 26 which connect the solder balls 18 of the BGA package 14 to pins 28 of the pin grid array of the multi-layered PGA interposer 16. As illustrated, the links 26 are not necessarily straight, but may zig-zag in order to properly align the pins 28 to fit into a PGA socket (not shown). The PGA socket can be either a standard or custom PGA socket. The PGA socket would normally be mounted to either a circuit board, e.g., fatherboard, which would then be connected to a motherboard. On the other hand, the PGA socket can be mounted directly to a motherboard. Therefore, the multi-layered PGA interposer 14 converts or adapts the BGA footprint of the BGA package 16 to a PGA footprint, thereby allowing the semiconductor device 12 to be tested using a PGA socket on a fatherboard or motherboard.

Figure 2:
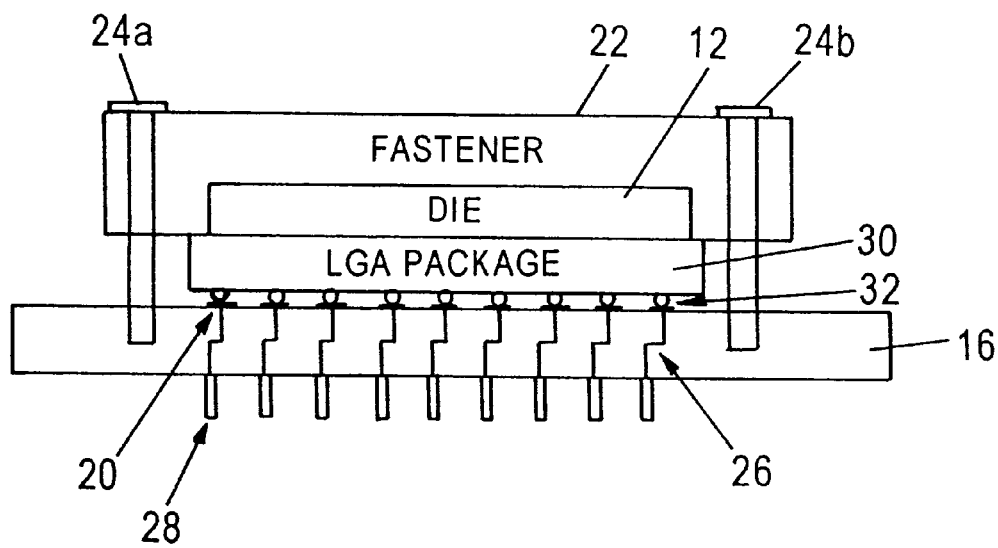
FIG. 2 is a side view of an exemplary multi-layered PGA interposer for converting a semiconductor device having a land grid array footprint to a pin grid array footprint according to an embodiment of the present invention.

FIG. 2 is a side view of an exemplary multi-layered PGA interposer for converting a semiconductor device having a land grid array (LGA) footprint to a pin grid array footprint according to an embodiment of the present invention. As illustrated, LGA footprints can be converted in a similar manner as described above for BGA footprints. For an LGA package 30, the land 32 and bond pad 20 pairs provide an electrical connection between the LGA package 30 and the multi-layered PGA interposer 16.

Figure 3:
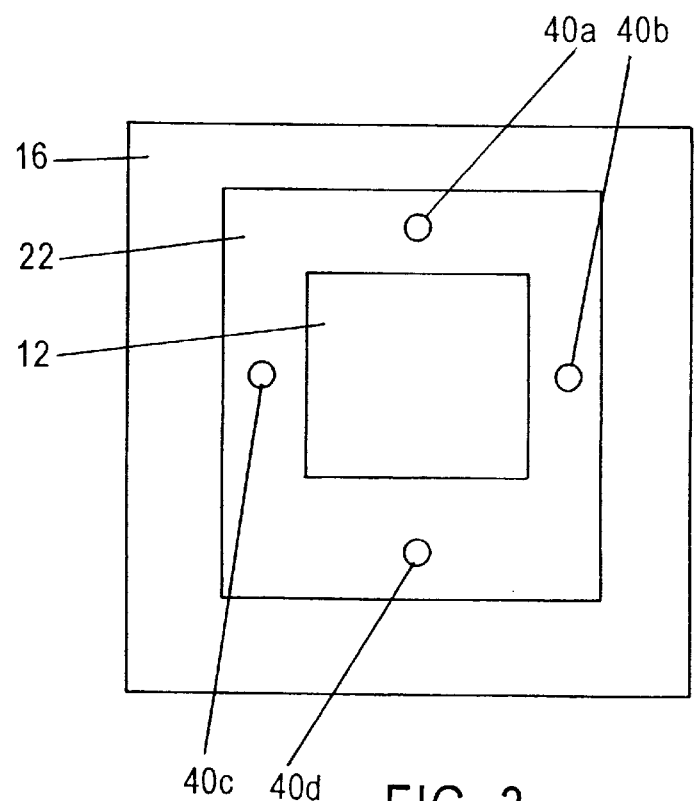
FIG. 3 is a top view of a semiconductor device fastened to an exemplary multi-layered PGA interposer according to an embodiment of the present invention.

FIG. 3 is a top view of a semiconductor device fastened to an exemplary multi-layered PGA interposer according to an embodiment of the present invention. As shown, there are four screws 40a, 40b, 40c, and 40d which fasten the fastener 22 to the PGA interposer 16. The fastener 22 in certain embodiments includes a cutout in the center to allow a cooler (not shown) to be placed on top of the semiconductor device 12. In alternate embodiments, the fastener 22 varies in shape and other types of fasteners can be used to fasten the non-pin grid array package 14 to the multi-layered PGA interposer 16. The fastener 22 presses the leads, the solder balls for a BGA package or the lands for an LGA package, of a non-pin grid array package to the bond pads 20 of the multi-layered PGA interposer 16, thereby ensuring electrical connectivity between the leads on the bottom of the non-pin grid array package and the bond pads 20 of the multi-layered PGA interposer 16. In certain embodiments, a fastener is not needed if there are adequate electrical connections between the leads on the bottom of the non-pin grid array package and the bond pads 20 of the multi-layered PGA interposer 16.

Figure 4:
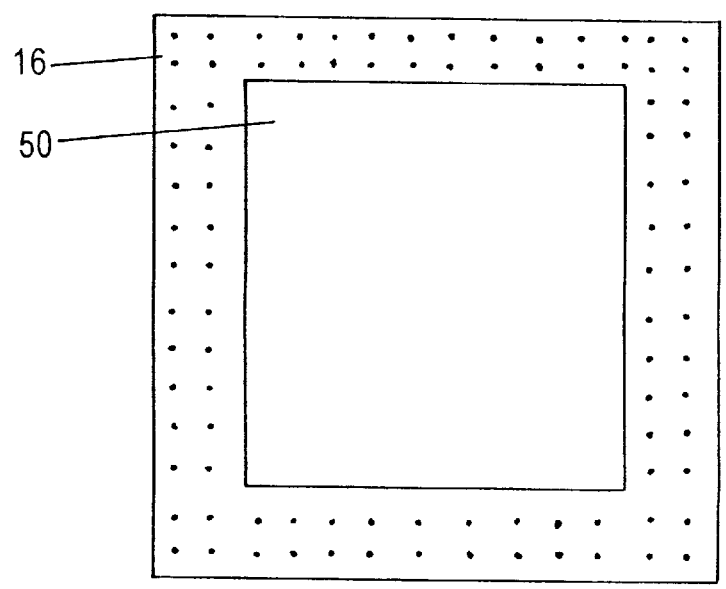
FIG. 4 is a bottom view of an exemplary multi-layered PGA interposer according to an embodiment of the present invention.

FIG. 4 is a bottom view of an exemplary multi-layered PGA interposer according to an embodiment of the present invention. The pins 28 on the bottom surface of the multi-layered PGA interposer 16 are positioned such that the multi-layered PGA interposer 16 fits into a standard PGA socket, such as PGA sockets manufactured by Robinson Nugent, Inc. of New Albany, Ind. In alternate embodiments, the pin grid array footprint of the multi-layered PGA interposer can fit into custom PGA sockets.

Figure 5:
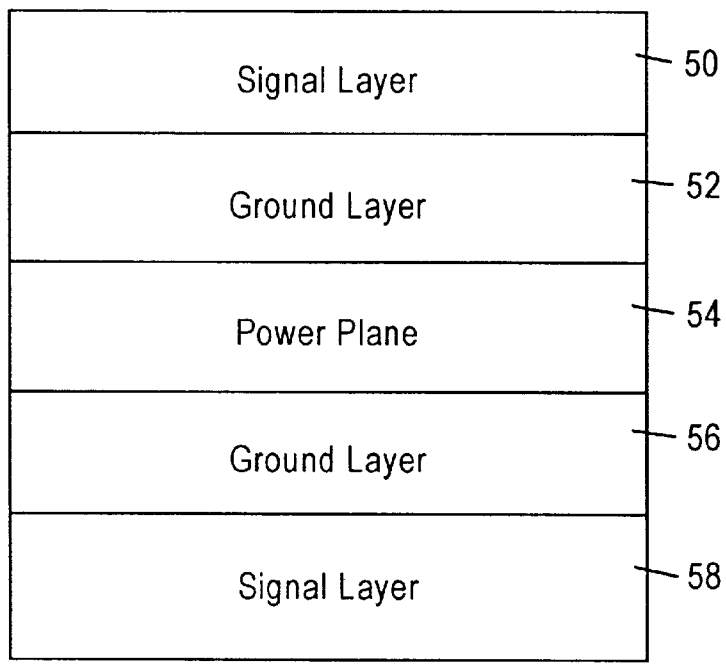
FIG. 5 illustrates the different layers of an exemplary multi-layered PGA interposer according to an embodiment of the present invention.

FIG. 5 illustrates the different layers of an exemplary multi-layered PGA interposer according to an embodiment of the present invention. As shown, the top and bottom layers of the multi-layered PGA interposer 16 are signal layers 50, 58. The signal layers 50, 58 are used to provide input signals to the semiconductor device 12 and provide output signals from the semiconductor device 12. For example, the bonding pads 20 shown in FIGS. 1 and 2 are on the top surface of signal layer 50 and the pins 28 shown in FIGS. 1 and 2 are on the bottom surface of signal layer 58. The ground layers 52, 56 are conductive layers and shield the power plane 54 from the signal layers 50, 58. The power plane 54 is between ground layers 52, 56. The power plane 54 is a conductive layer for providing power to one or more points on the semiconductor device 12.

By placing the power plane 54 between the ground layers 52, 56, the multi-layered PGA interposer 16 reduces crosstalk between the different layers, thus minimizing noise and helping to prevent voltage drops between the layers. By reducing crosstalk, the multi-layered PGA interposer 16 provides cleaner, e.g., less noisy, signals between the semiconductor device 12 and a motherboard to which the multi-layered PGA interposer 16 is connected directly or indirectly through a fatherboard. Specifically, the multi-layered PGA interposer 16 produces cleaner signals on the input/output pins connected to the motherboard. By producing cleaner signals, the multi-layered PGA interposer 16 provides more accurate test results during testing of the semiconductor devices 12.

Figure 6:
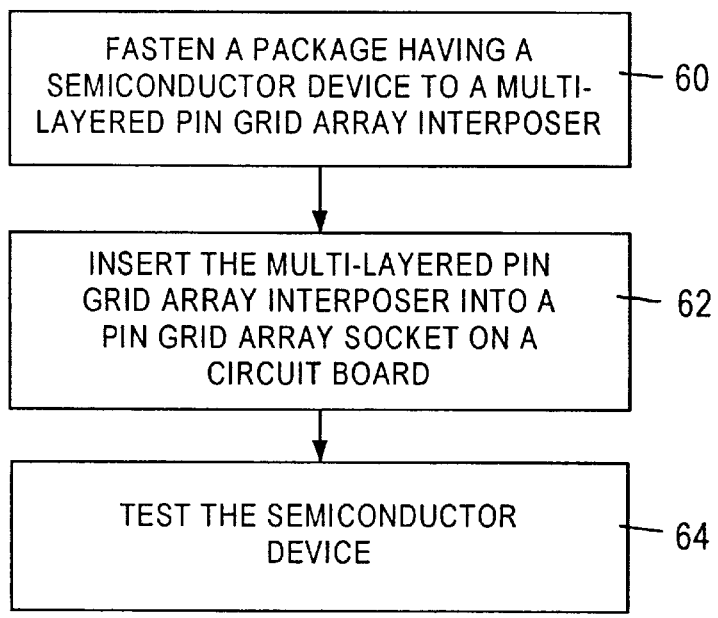
FIG. 6 is a flow chart illustrating the steps of testing a semiconductor device in conjunction with the multi-layered PGA interposer in accordance with an embodiment of the present invention.

Referring to FIG. 6, a flow chart of the steps of testing a semiconductor device in conjunction with the multi-layered PGA interposer in accordance with an embodiment of the present invention is illustrated. At step 60, the semiconductor device 12 and the package 12 having a non-pin grid array footprint are fastened to the multi-layered PGA interposer 16 using the fastener 22. At step 62, the multi-layered PGA interposer 16 is inserted into a PGA socket which is mounted on a circuit board. At step 64, the semiconductor device 12 is tested by sending power, ground and test signals through the circuit board to the PGA socket. Since, the PGA socket is attached to the multi-layered PGA interposer 16, the signals pass through the different layers of the multi-layered PGA interposer 16 to the package 14 which passes them to the semiconductor device 12.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A multi-layered pin grid array interposer for converting a non-pin grid array footprint of a semiconductor device on a package to a pin grid array footprint, the pin grid array interposer comprising:

a top signal layer having a plurality of bonding pads on an upper surface;

a bottom signal layer having a pin grid array footprint on a bottom surface;

at least one power plane between ground layers, the ground layers being between the top signal layer and the bottom signal layer; and a plurality of links for connecting the plurality of bonding pads to a plurality of pins of the pin grid array footprint.

2. The multi-layered pin grid array interposer of claim 1, wherein the bonding pads are positioned to align with solder balls from a ball grid array package.

3. The multi-layered pin grid array interposer of claim 1, wherein the bonding pads are positioned to align with lands from a land grid array package.

4. A multi-layered pin grid array interposer test socket for testing a semiconductor on a package and converting a non-pin grid array footprint of the package to a pin grid array footprint, the multi-layered pin gird array interposer test socket comprising:

a multi-layered pin grid array interposer comprising:
   a top signal layer having a plurality of bonding pads on an upper surface;
   a bottom signal layer having a pin grid array footprint on a bottom surface;
   at least one power plane between ground layers, the ground layers being between the top signal layer and the bottom signal layer; and
   a plurality of links for connecting the plurality of bonding pads to a plurality of pins of the pin grid array footprint;

the non-pin grid array footprint of the package further comprising a plurality of leads; and a fastener for compressing the package with the multi-layered pin grid array interposer thereby providing connections between the plurality of leads and the plurality of bonding pads.

5. The multi-layered pin grid array interposer test socket of claim 4, wherein the package is a ball grid array package and the leads are solder balls.

6. The multi-layered pin grid array interposer test socket of claim 4, wherein the package is a land grid array package and the leads are lands.

7. The multi-layered pin grid array interposer test socket of claim 4, further comprising screws for compressing the fastener to the multi-layer pin grid array interposer.

8. The multi-layered pin grid array interposer test socket of claim 4, further comprising a pin grid array socket configured to receive the multi-layered pin grid array interposer.

9. The multi-layered pin grid array interposer test socket of claim 8, further comprising the pin grid array socket being mounted on a circuit board.

10. The multi-layered pin grid array interposer test socket of claim 9, wherein the circuit board is a fatherboard.

11. The multi-layered pin grid array interposer test socket of claim 9, wherein the circuit board is a motherboard.

12. The multi-layered pin grid array interposer test socket of claim 4, wherein the semiconductor device is a microprocessor.

* * * * *